(12) United States Patent
Law et al.

(10) Patent No.: US 8,791,578 B2
(45) Date of Patent: Jul. 29, 2014

(54) THROUGH-SILICON VIA STRUCTURE WITH PATTERNED SURFACE, PATTERNED SIDEWALL AND LOCAL ISOLATION

(71) Applicant: Hong Kong Applied Science and Technology Research Institute Company Limited, Hong Kong (HK)

(72) Inventors: Pui Chung Simon Law, Hong Kong (HK); Bin Xie, Hong Kong (HK); Dan Yang, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 0 days.

(21) Appl. No.: 13/674,096

(22) Filed: Nov. 12, 2012

(65) Prior Publication Data

US 2014/0131882 A1    May 15, 2014

(51) Int. Cl.
*H01L 23/48* (2006.01)
*H01L 21/56* (2006.01)
*H01L 21/768* (2006.01)

(52) U.S. Cl.
CPC ........ *H01L 23/481* (2013.01); *H01L 21/76898* (2013.01); *H01L 21/56* (2013.01)
USPC .............. 257/774; 257/E23.01; 257/E23.025; 257/E23.067; 257/E23.078; 257/E23.169; 257/E23.174; 257/621; 257/692; 257/672; 257/751; 257/773; 257/780; 257/686; 257/689; 257/723; 257/778

(58) Field of Classification Search
USPC .......... 257/774, 621, E23.011, E21.597, 692, 257/672, E23.01, E21.305, 751, E23.16, 257/773, 780, 686, 689, 723, 778, E23.021, 257/E23.024, E23.025, E23.067, E23.078, 257/E23.169, E23.174
See application file for complete search history.

(56) References Cited

U.S. PATENT DOCUMENTS

| | | | |
|---|---|---|---|
| 7,358,592 B2 * | 4/2008 | Ueno ............................ | 257/536 |
| 7,808,064 B2 | 10/2010 | Kawasaki et al. | |
| 7,915,736 B2 * | 3/2011 | Kirby et al. .................... | 257/774 |
| 7,969,015 B2 * | 6/2011 | Trezza .......................... | 257/777 |
| 8,049,327 B2 | 11/2011 | Kuo et al. | |
| 8,053,807 B2 | 11/2011 | Kwon et al. | |
| 8,187,972 B2 | 5/2012 | Stupar et al. | |
| 8,232,626 B2 * | 7/2012 | Tsui et al. ...................... | 257/621 |
| 8,598,714 B2 * | 12/2013 | Huisinga et al. .............. | 257/774 |

(Continued)

*Primary Examiner* — Alexander Oscar Williams
(74) *Attorney, Agent, or Firm* — Ella Cheong Hong Kong; Sam T. Yip

(57) ABSTRACT

This invention discloses a through-silicon via (TSV) structure for providing an electrical path between a first-side surface and a second-side surface of a silicon chip, and a method for fabricating the structure. In one embodiment, the TSV structure comprises a via penetrated through the chip from the first-side surface to the second-side surface, providing a first end on the first-side surface and a second end on the second-side surface. A local isolation layer is deposited on the via's sidewall and on a portion of the first-side surface surrounding the first end. The TSV structure further comprises a plurality of substantially closely-packed microstructures arranged to form a substantially non-random pattern and fabricated on at least the portion of the first-side surface covered by the local isolation layer for promoting adhesion of the local isolation layer to the chip. A majority of the microstructures has a depth of at least 1 μm.

20 Claims, 9 Drawing Sheets

(56) References Cited

U.S. PATENT DOCUMENTS

| | | | |
|---|---|---|---|
| 8,610,259 B2* | 12/2013 | Oganesian et al. | 257/692 |
| 2005/0156279 A1* | 7/2005 | Shioga et al. | 257/532 |
| 2009/0108464 A1* | 4/2009 | Uchiyama | 257/774 |
| 2010/0120227 A1* | 5/2010 | Grivna et al. | 438/462 |
| 2010/0181612 A1* | 7/2010 | Kito et al. | 257/319 |
| 2011/0304026 A1* | 12/2011 | Tsui et al. | 257/621 |
| 2012/0139124 A1* | 6/2012 | Oganesian et al. | 257/774 |
| 2012/0220079 A1* | 8/2012 | Fujii | 438/107 |
| 2013/0089701 A1* | 4/2013 | Hooper et al. | 428/131 |
| 2013/0115730 A1* | 5/2013 | El-Gamal et al. | 438/51 |
| 2013/0249096 A1* | 9/2013 | Eissa et al. | 257/751 |

* cited by examiner

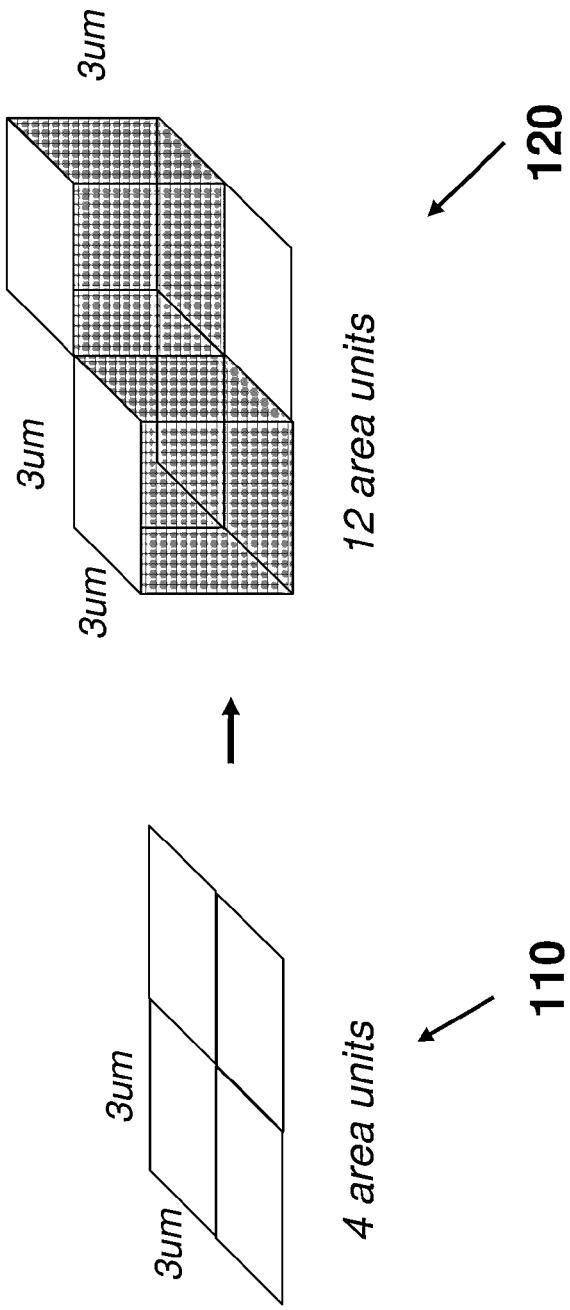

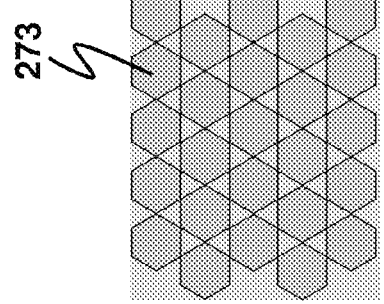
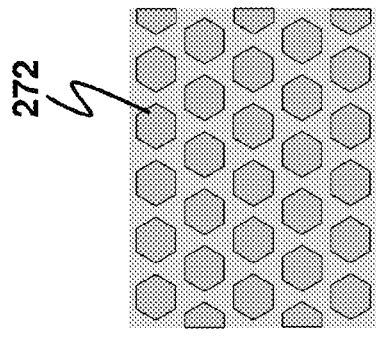
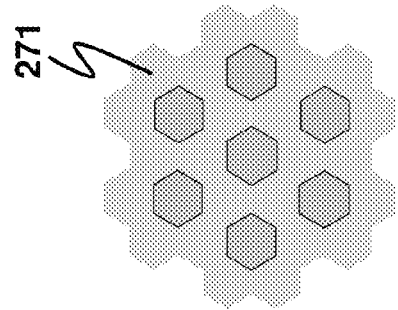
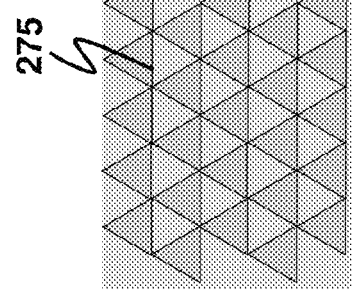
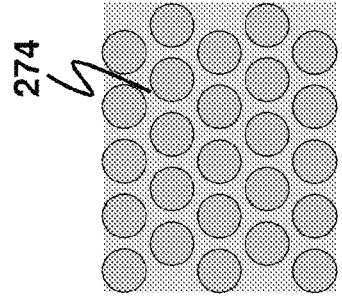
FIG. 2C

THROUGH-SILICON VIA STRUCTURE WITH PATTERNED SURFACE, PATTERNED SIDEWALL AND LOCAL ISOLATION

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to a through-silicon via structure for a silicon chip. In particular, this invention relates to the use of a patterned surface and a patterned sidewall for promoting adhesion of a local isolation layer to a bulk of the silicon chip, and furthermore to the use of local isolation for promoting reliability of the local isolation layer.

BACKGROUND

Packaging requirements for semiconductor devices have become more stringent as the competing demands for increased functionality and smaller electronic products continue to force device manufacturers to create ever more complex package designs. In particular, increased demands for compact devices have led package manufacturers to pursue vertical integration of multiple chips to decrease the overall package size, permitting smaller final electronic products. For example, "system-in-package" designs can be created for CMOS image sensors with associated digital signal processors and memory chips. A method to electrically interconnect the chips in vertically integrated packages is by forming through-silicon vias (TSVs) through silicon chips and filling the TSVs with conductors that connect to solder bumps positioned beneath each chip.

Since a bulk of a silicon chip is electrically semi-conducting, it is required to insulate a TSV before filling it with a conductor. Similarly, a silicon surface around the TSV and on which the conductor runs is also required to be insulated. To insulate the TSV and the surrounding silicon surface, one method is to deposit a layer of silicon oxide by a process using a high temperature of around 300° C. This high-temperature process, however, affects the integrated circuit already present on the silicon chip, reducing the circuit reliability and sometimes damaging the circuit. Furthermore, this high-temperature process is rather costly. An alternative method not involving high temperature is to deposit an isolation layer, typically a polymer layer, by applying liquid polymer onto the TSV and the surrounding silicon surface, or by chemical vapor deposition (CVD) of the polymer. CVD of the polymer is particularly useful if the depth of the TSV is considerably greater than the cross-sectional width thereof. However, a problem with polymer CVD is that delamination of the polymer layer at an interface with the silicon surface or a sidewall of the TSV may occur, thereby reducing the reliability of the conductor that is deposited on the polymer layer. Delamination of the polymer layer is a result that the bonding power of polymer to silicon is not sufficient.

U.S. Pat. No. 8,049,327 discloses a method to reduce occurrence of delamination by employing a sidewall of a TSV with a scalloped surface. As a result of the use of the scalloped surface, the sidewall appears to have a number of concentric rings attached thereto. The surface area of the sidewall is thereby increased so that adhesion of a polymer layer to the sidewall is enhanced. However, the arrangement of using the scalloped surface is not directly applicable to a flat silicon surface surrounding the TSV.

A method to increase the adhesion of a polymer layer to a silicon surface is based on roughening the surface by a two-dimensional blanket etch, such as reactive ion etching (RIE), deep reactive ion etching (DRIE) and wet etching, of the silicon surface. Due to difficulty in controlling evenness of the roughening across the silicon chip, the adhesion reliability of the polymer layer is difficult to be ensured for some systems-in-packages.

There is a need in the art to have improved methods for promoting adhesion of a polymer layer or an isolation layer to a silicon surface.

SUMMARY OF THE INVENTION

The present invention discloses a TSV structure for providing an electrical path between a first side and a second side of a silicon chip. The first side has a first-side surface and the second side has a second-side surface. The TSV structure comprises a via penetrated through the chip from the first-side surface to the second-side surface, providing a first end on the first-side surface and a second end on the second-side surface. A local isolation layer is deposited on the via's sidewall and on a portion of the first-side surface surrounding the first end. The TSV structure further comprises a plurality of substantially closely-packed microstructures arranged to form a substantially non-random pattern and fabricated on at least the portion of the first-side surface covered by the local isolation layer for promoting adhesion of the local isolation layer to the chip, wherein a majority of the microstructures has a depth of at least 1μm.

Preferably, a majority of the microstructures has a width between 2 μm and 4 μm. It is also preferable that the local isolation layer is substantially composed of a polymer material. The via may be tapered or vertical. The sidewall of the via may include a plurality of steps or scallops configured to promote adhesion between the sidewall and the local isolation layer deposited thereon, and wherein a majority of the steps or a majority of the scallops has a depth greater than 1 μm.

It is preferable that a conductive layer is deposited on the local isolation layer to substantially cover, without contacting, the via's sidewall and the portion of the first-side surface covered by the local isolation layer, wherein the local isolation layer deposited on the first-side surface has an outer boundary substantially aligned with an outer boundary of the conductive layer that overlies the first-side surface. Preferably, the conductive layer is substantially composed of metal.

Preferably, the TSV structure further comprises a protective layer deposited on the conductive layer for covering the conductive layer and the local isolation layer. The protective layer may be substantially composed of a polymer material.

Preferably, the TSV structure further comprises a soft protection material deposited on the first-side surface, and attached to both the outer boundary of the local isolation layer deposited on the first-side surface and the outer boundary of the conductive layer that overlies the first-side surface, in order to protect edges of the local isolation layer and of the conductive layer from being exposed.

Optionally, the outer boundary of the local isolation layer deposited on the first-side surface is substantially aligned with a smallest outer boundary formed by enclosing the plurality of microstructures.

The second end of the via may be covered with a metal bond pad located on the second-side surface, allowing the conductive layer to attach to the metal bond pad so as to form the electrical path between the first side and the second side.

The present invention further discloses a method for forming a through-silicon via structure configured to provide an electrical path between a first side and a second side of a silicon chip, where the first side has a first-side surface, the second side has a second-side surface, and the chip has a metal bond pad attached to the second-side surface. In the method, a plurality of substantially closely-packed microstructures is fabricated on the first-side surface, wherein the microstructures are arranged to form a substantially non-random pattern, and wherein a majority of the microstructures has a depth of at least 1 μm. A via through the chip from the first-side surface to the second-side surface is then formed in order that the metal bond pad is exposed to the first side through the via. Afterwards, a first material, preferably a polymer material, is deposited onto the first side without allowing the first material to cover a substantial part of the metal bond pad that is exposed to the first side. Metal is subsequently deposited onto the first side and then part of the metal is selectively removed therefrom so as to form a conductive layer on the substantial part of the metal bond pad that is exposed to the first side, on the via's sidewall and on a portion of the first-side surface surrounding the via. The first material that resides on the first-side surface not covered by the conductive layer is then removed, so as to form a local isolation layer to isolate the conductive layer from a bulk of the chip. Thereafter, a second material, preferably a polymer material, is deposited onto the first side, and then part of the second material is selectively removed therefrom to form a protective layer. It is then followed by depositing a soft protection material, which is preferably a polymer material, onto the first side, and then selectively removing part of the soft protection material therefrom. Preferably, the method further comprises performing solder bump deposition and under bump metallization.

Preferably, the forming of the via includes forming a plurality of steps or scallops on the via's sidewall with a majority of the steps or a majority of the scallops having a depth greater than 1 μm.

The first material that resides on the first-side surface not covered by the conductive layer may be removed by etching the first material and employing the conductive layer as a mask in the etching to protect the first material covered by the conductive layer from being etched.

Depositing the first material onto the first side without allowing the first material to cover the substantial part of the metal bond pad that is exposed to the first side may be performed by: non-selectively depositing the first material onto the first side so as to cover the first-side surface, the via's sidewall, and the metal bond pad that is exposed to the first side; and selectively removing a substantial part of the first material that has been deposited on the metal bond pad, so as to form a contact opening on the metal bond pad for exposing the metal bond pad to the first side.

Additionally, the present invention discloses a method for promoting adhesion of a local isolation layer to a surface of a silicon chip. The method comprises before depositing the local isolation layer onto the surface, fabricating a plurality of substantially closely-packed microstructures on at least an area of the surface intended for the local isolation layer to be deposited, wherein the microstructures are arranged to form a substantially non-random pattern, and wherein a majority of the microstructures has a depth of at least 1 μm. The local isolation layer may be substantially composed of a polymer material.

BRIEF DESCRIPTION OF THE DRAWINGS

FIG. 1 is an example illustrating the use of microstructures on a silicon surface to increase the surface area that contacts with an isolation layer.

DETAILED DESCRIPTION

As used herein in the specification and in the appended claims, the term "via" is used in a broad sense to mean any opening in an electrical material layer or layers that allow a conductive connection between layers. Various other similar terms such as trench or channel are encompassed by the term "via" as used in describing the present invention.

Adhesion to an isolation layer such as a polymer layer can be increased by increasing the contact area of a silicon surface on which the isolation layer is attached. According to the present invention, the contact area is increased by fabricating microstructures onto the silicon surface. FIG. 1 shows an example that the contact area can be increased by means of the microstructures. In the example shown in FIG. 1, an original flat surface 110 is composed of four squares, each measuring 3 μm×3 μm. This flat surface 110 yields a contact area of 4 area units. If two microstructures each in the form of a cube measuring 3 μm×3 μm×3 μm are fabricated on diagonal positions over the four squares, it gives rise to a surface 120 having a contact area of 12 area units.

The contact area provided by a pattern of microstructures forming a texture on the silicon surface can be maximized by noting the following factors. First, a microstructure is a three-dimensional structure having a depth. The inventors have identified that if the depth is greater than the contact area can be significantly increased such that adhesion of the isolation layer to the silicon surface can be enhanced considerably. Second, the microstructures can be arranged to be closely-packed so as to maximize the contact area. For example, the microstructures can be made closely-packed by having the microstructures' bases (i.e. the bottom faces of the microstructures in contact with the silicon surface) substantially similar to each others. Another example of making closely-packed microstructures is that adjacent microstructures can be arranged to touch each others. Third, the microstructures can be positioned to exhibit a non-random pattern. An example of such a non-random pattern is a pattern with a periodic structure, such as a checkerboard pattern.

Figure 2A:
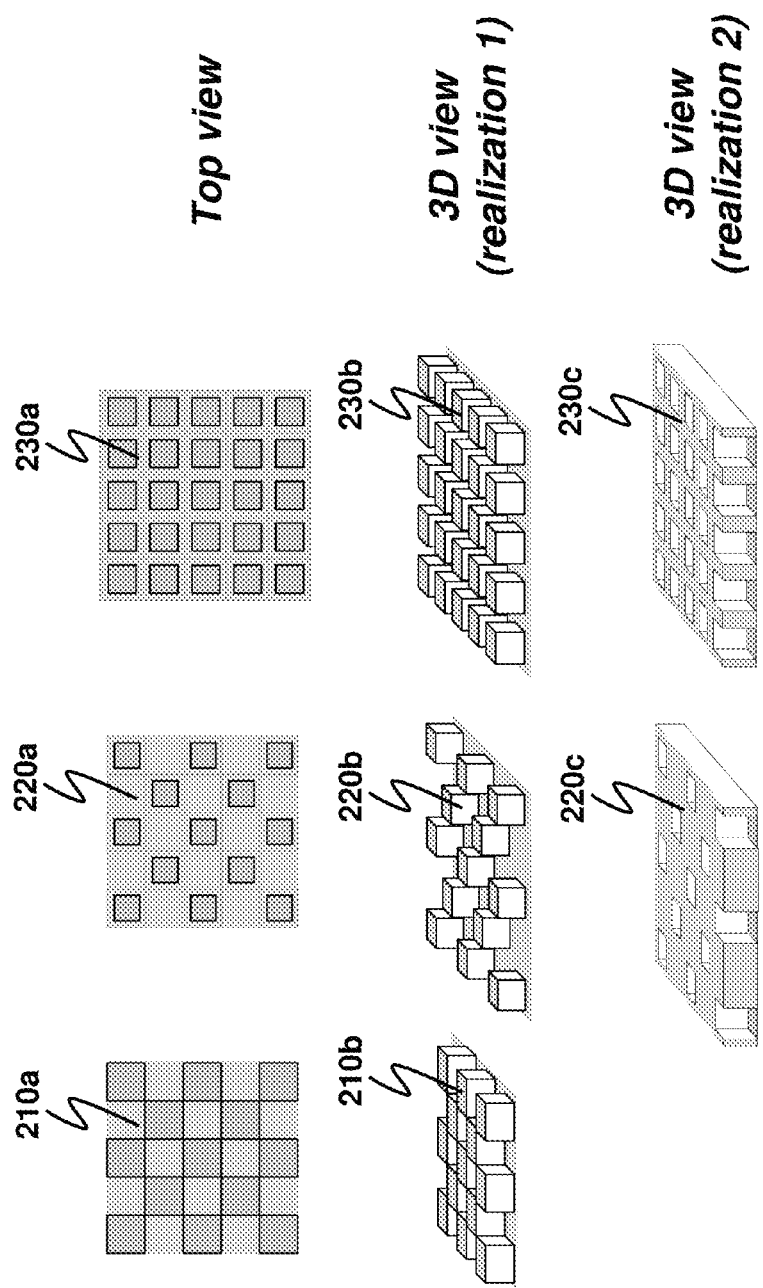
FIG. 2 depicts examples of microstructures and their arrangements (i.e. resultant patterns), in which microstructures shown in FIG. 2A and FIG. 2B are based on cubic surface texture design while those depicted in FIG. 2C are based on other surface texture design.
Figure 2B:
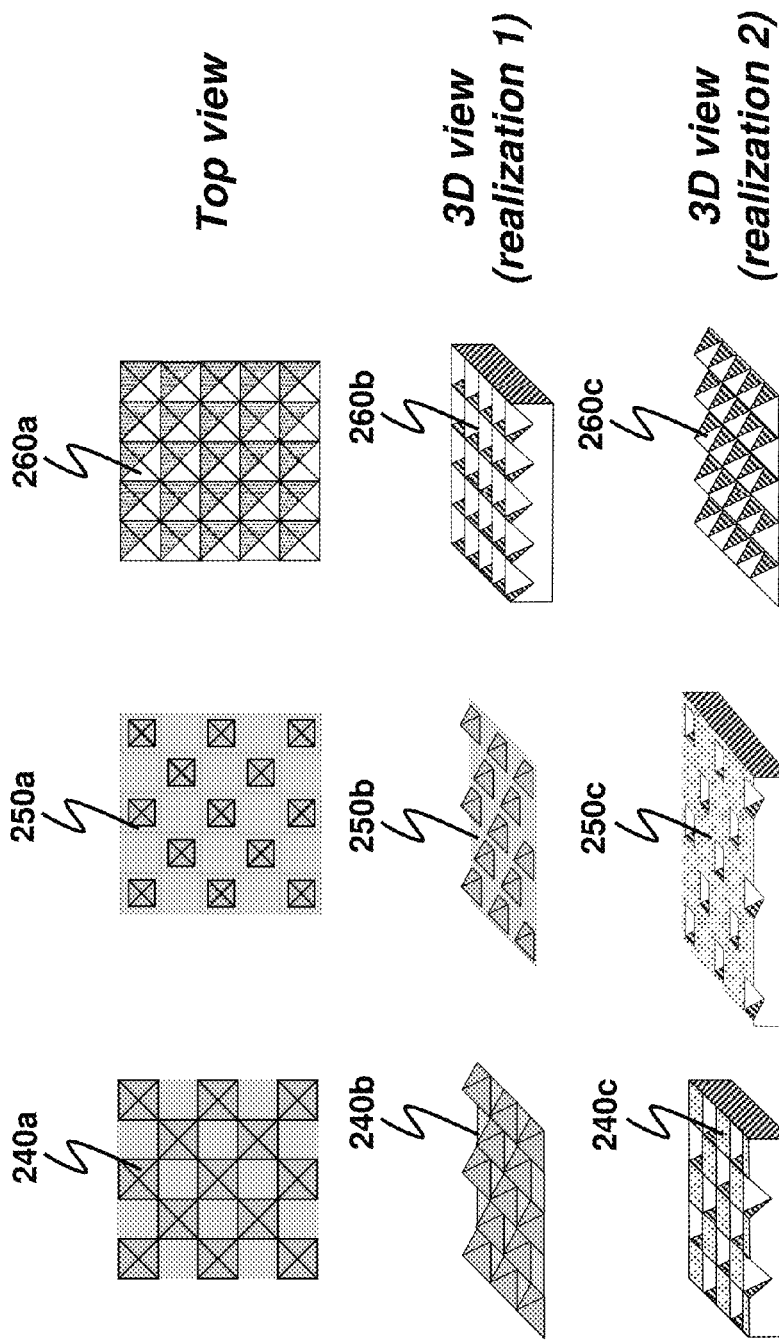

FIG. 2 shows examples of microstructures and their arrangements (i.e. resultant patterns) in accordance with embodiments of the present invention. In FIG. 2A and FIG. 2B, examples of patterns based on microstructures having cubic surface textures are shown. A top view, e.g. 230a, of a plurality of microstructures forms a planar view of a pattern. Based on a top view, two realizations are possible. For example, a realization 230b and its inverted realization 230c can be formed from the top view 230a. A microstructure in a pattern may be realized in any shape. In one example, a shape of a cuboid is used for forming microstructures in realizations 210b, 220b and 230b as shown in FIG. 2A. In another example, as is shown in FIG. 2B, microstructures in realizations 240b, 250b and 260b are formed with a shape of a pyramid. In FIG. 2C, examples of patterns with microstructures having other surface textures are depicted. Only top views, which are provided as top views 271-275, are shown.

In addition, the inventors have identified that it is preferable to have a width of each microstructure's base to be between 2 μm and 4 μm. This range of value is preferable if the isolation layer is made of polymer. Herein in the specification and in the appended claims, "width" of a two-dimensional figure with an arbitrary shape is defined as the smallest distance that can be formed between two opposite parallel lines tangent to the boundary of the figure.

Figure 3:
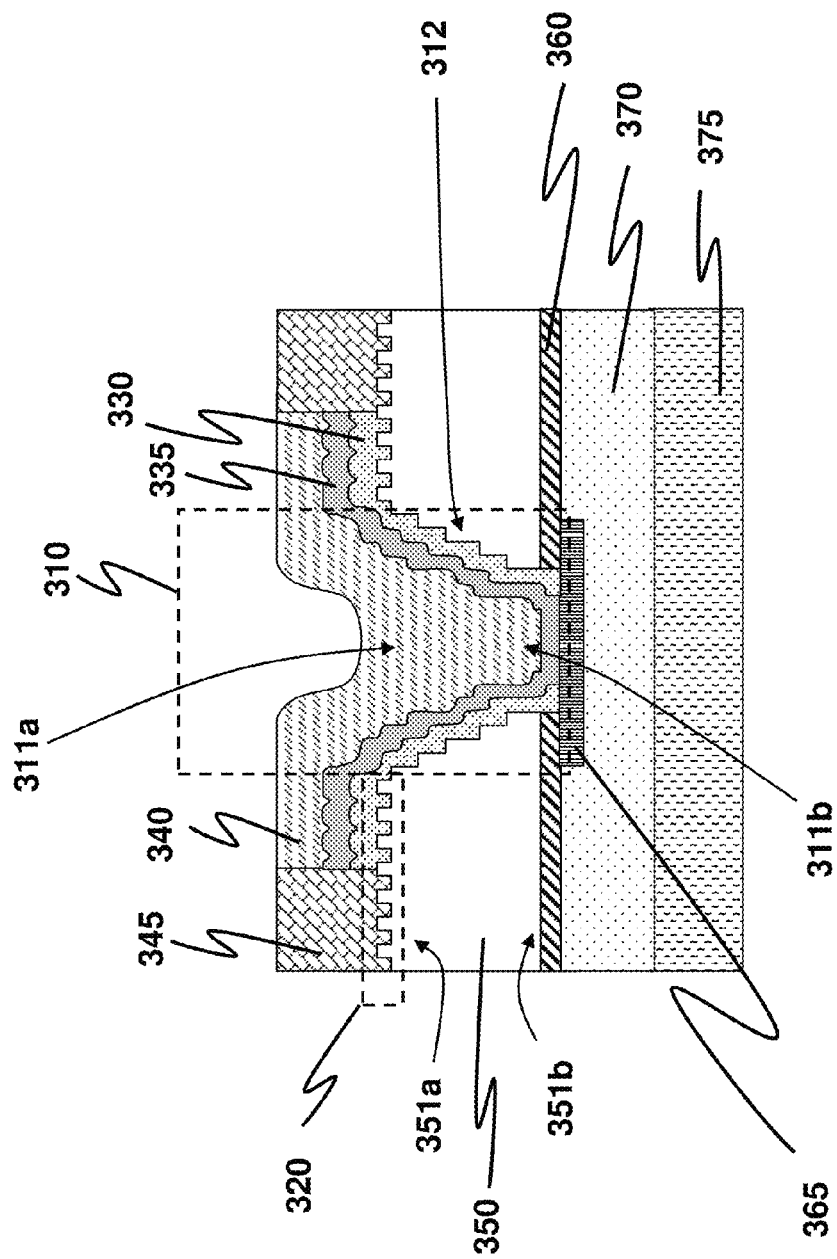
FIG. 3 is a TSV structure in accordance with an embodiment of the present invention.

According to an exemplary embodiment of the present invention, a TSV structure is depicted in FIG. 3. The TSV structure is fabricated for a silicon chip 350. The silicon chip 350 has a first side and a second side that is opposite to the first side. The first side has a first-side surface 351a on a bulk of the silicon chip 350. The second side has a second-side surface 351b. The TSV structure provides an electrical path between the first-side surface 351a and the second-side surface 351b. For convenience in describing the TSV structure, without loss of generality it is considered one case that the second side of the silicon chip 350 contains active components of the integrated circuit. Correspondingly, the first side is a back side of the silicon chip 350. On the second-side surface 351b, there is a passivation layer 360. Due to fragility of the silicon chip 350, the silicon chip 350 may be attached to a substrate 375 for additional mechanical support and protection to the integrated circuit. A layer of epoxy 370 may be used to stick together the silicon chip 350 and the substrate 375.

The TSV structure comprises a via 310 penetrated through the chip 350 from the first-side surface 351a to the second-side surface 351b. The via 310 has a first end 311a on the first-side surface 351a and a second end 311b on the second-side surface 351b. A local isolation layer 330, which is electrically insulating, is deposited on a sidewall 312 of the via 310 and on a portion of the first-side surface 351a surrounding the first end 311a. Preferably, the local isolation layer 330 is substantially composed of a polymer material. The TSV structure further comprises a plurality of substantially closely-packed microstructures 320 arranged to form a substantially non-random pattern and fabricated on at least the portion of the first-side surface 351a covered by the local isolation layer 330 for promoting adhesion of the local isolation layer 330 to the chip 350, wherein a majority of the microstructures 320 has a depth of at least 1 μm. Preferably, a majority of the microstructures 320 has a width between 2 μm and 4 μm.

In FIG. 3, the via 310 is a tapered one, in which the first end 311a has an area different from an area of the second end 311b. In another embodiment not shown in FIG. 3, the via 310 is vertical, having the sidewall 312 that is substantially vertical.

Figure 4:
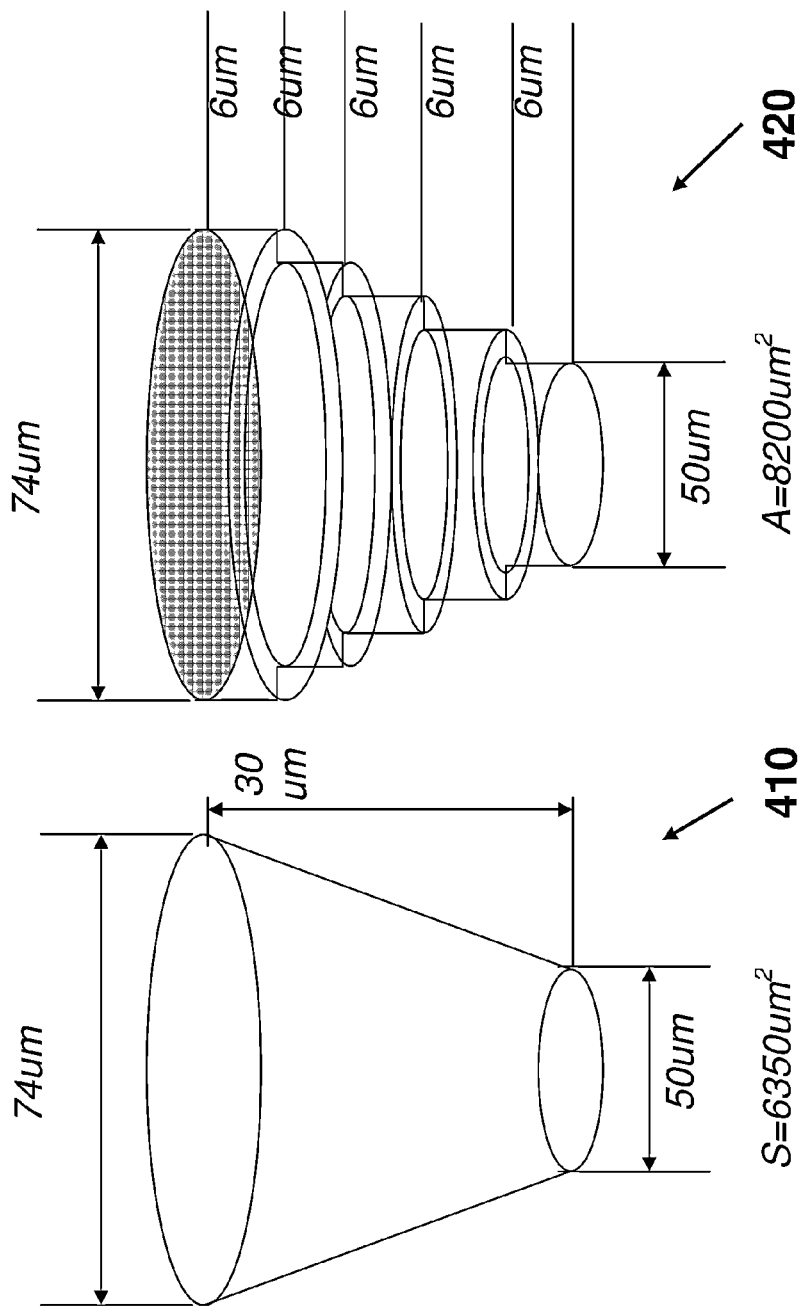
FIG. 4 is an example showing an increase of surface area by employing steps or scallops on a sidewall of a TSV.

To promote adhesion of the local isolation layer 330 to the sidewall 312, the sidewall 330 may include a plurality of steps or scallops. In particular, a majority of the steps or a majority of the scallops has a depth greater than 1 μm in order to provide a substantial amount of adhesiveness to the local isolation layer 330. To show an increment in the contact surface area provided by the presence of the steps or scallops, FIG. 4 depicts an example, in which a tapered via 410 without any step on a sidewall gives a surface area of 6350 μm² while another via 420 having four steps increases the surface area to 8200 μm².

To provide the electrical path between the first-side surface 351a and the second-side surface 351b, a conductive layer 335, which typically is substantially composed of metal, is deposited on the local isolation layer 330 to substantially cover, without contacting, the sidewall 312 and the portion of the first-side surface 351a covered by the local isolation layer. Preferably, the local isolation layer 330 deposited on the first-side surface 351a has an outer boundary substantially aligned with an outer boundary of the conductive layer 335 that overlies the first-side surface 351a. It follows that the local isolation layer 330 substantially overlaps with the conductive layer 335. The inventors have found that, with this arrangement of alignment for both the local isolation layer 330 and the conductive layer 335, the local isolation layer 330 receives less mechanical stress than in the case that the local isolation layer 330 extends substantially beyond the conductive layer 335. Receiving less mechanical stress has an advantage that reliability of the local isolation layer 330 can be enhanced. Note that an inner boundary of the local isolation layer 330 deposited on the first-side surface 351a is a boundary of the first end 311a.

Preferably, the TSV structure further comprises a protective layer 340 deposited on the conductive layer 335 for covering the conductive layer 335 and the local isolation layer 330 to thereby provide protection to both these layers 335, 330. It is preferable that the protective layer 340 is substantially composed of a polymer material.

The TSV structure may further comprise a soft protection material 345 deposited on the first-side surface 351a, and attached to both the outer boundary of the local isolation layer 330 deposited on the first-side surface 351a and the outer boundary of the conductive layer 335 that overlies the first-side surface 351a, in order to protect edges of the local isolation layer 330 and of the conductive layer 335 from being exposed.

The TSV structure is used for providing the electrical path between the first-side surface 351a and the second-side surface 351b. Since it is considered that the second side of the silicon chip 350 contains active components of the integrated circuit, the integrated circuit is electrically connected to the first-side surface 351a through the conductive layer 335. The conductive layer 335 may be connected to a metal bond pad 365 at the second end 311b. The metal bond pad 365 resides on the passivation layer 360 attached to the second-side surface 351b, and is electrically connected to the integrated circuit.

From the disclosure given above, it is noted that adhesion of a local isolation layer to a surface of a silicon chip can be promoted by, before depositing the local isolation layer onto the surface, fabricating a plurality of substantially closely-packed microstructures on at least an area of the surface intended for the local isolation layer to be deposited, wherein the microstructures are arranged to form a substantially non-random pattern, and a majority of the microstructures has a depth of at least 1 μm.

Figure 5:
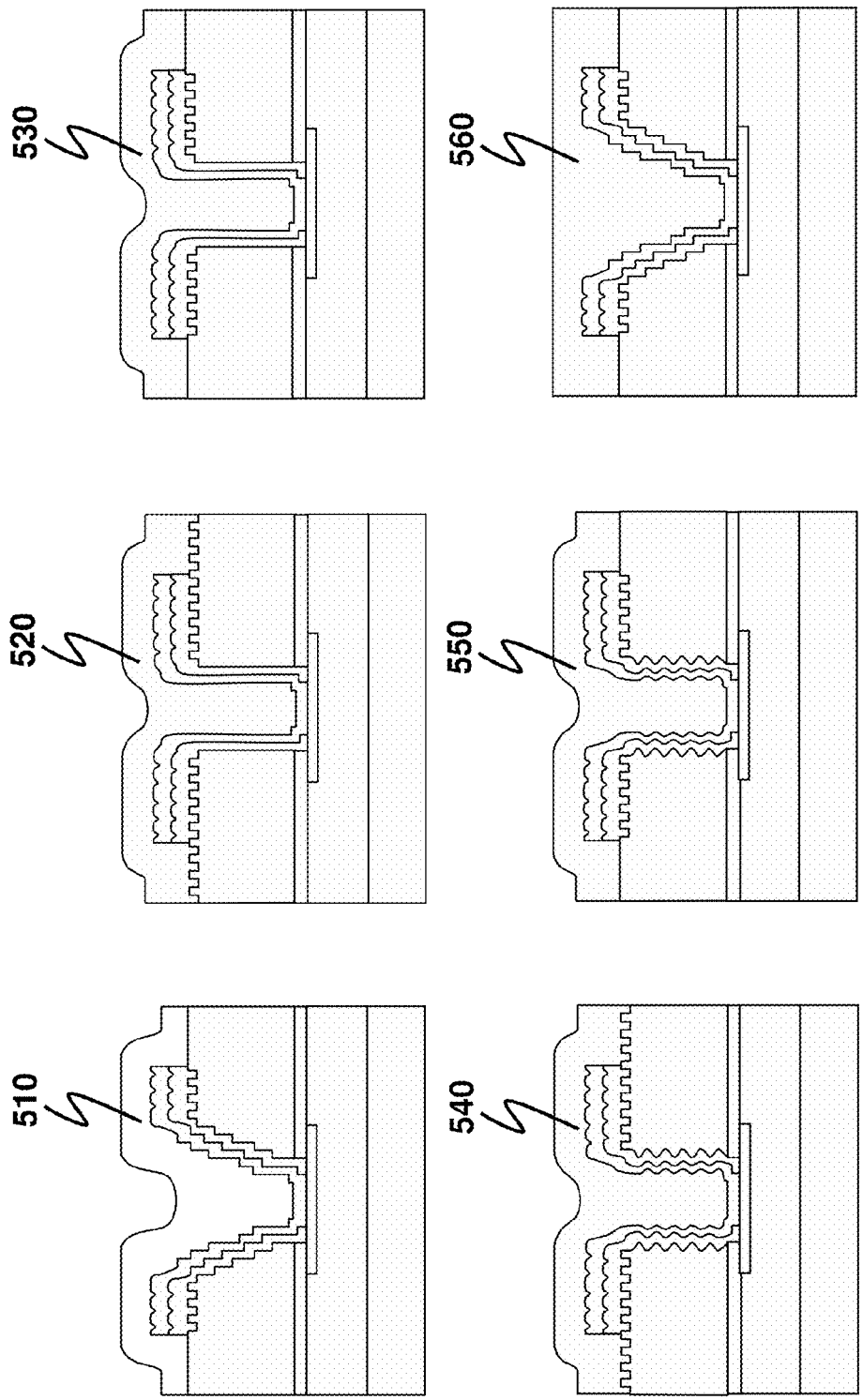
FIG. 5 depicts different configurations of the TSV in accordance with embodiments of the present invention.

In other embodiments, a variety of TSV structures are depicted in FIG. 5. Tapered vias with sidewalls having steps or scallops are employed in TSV structures 510 and 560. Vertical vias without using steps or scallops on sidewalls are employed in TSV structures 520 and 530. Vertical vias with steps or scallops on sidewalls are used in TSV structures 540 and 550. For each of TSV structures 510, 530, 550 and 560, a plurality of microstructures is fabricated on an area of a first-side surface substantially aligned with a local isolation layer. For each of TSV structures 520 and 540, a plurality of microstructures is fabricated on an area of a first-side surface substantially beyond a local isolation layer's boundary. For the TSV structure 560, a planar protective layer is used.

Figure 6:
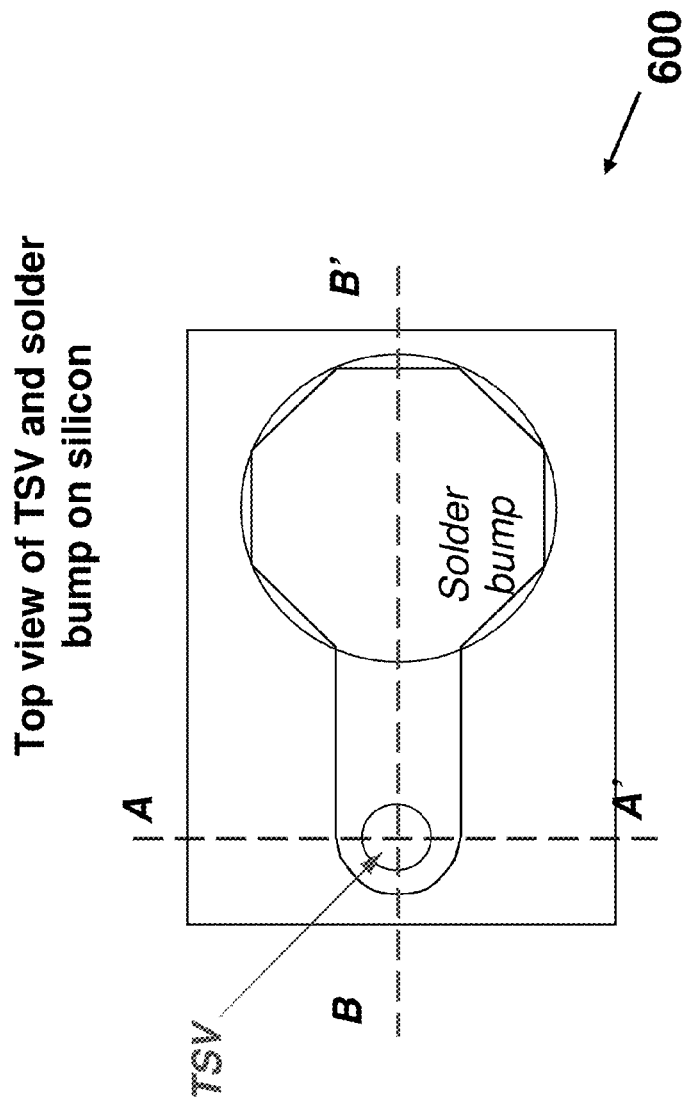
FIG. 6 shows a process for fabricating a TSV according to an embodiment of the present invention.
Figure 6:
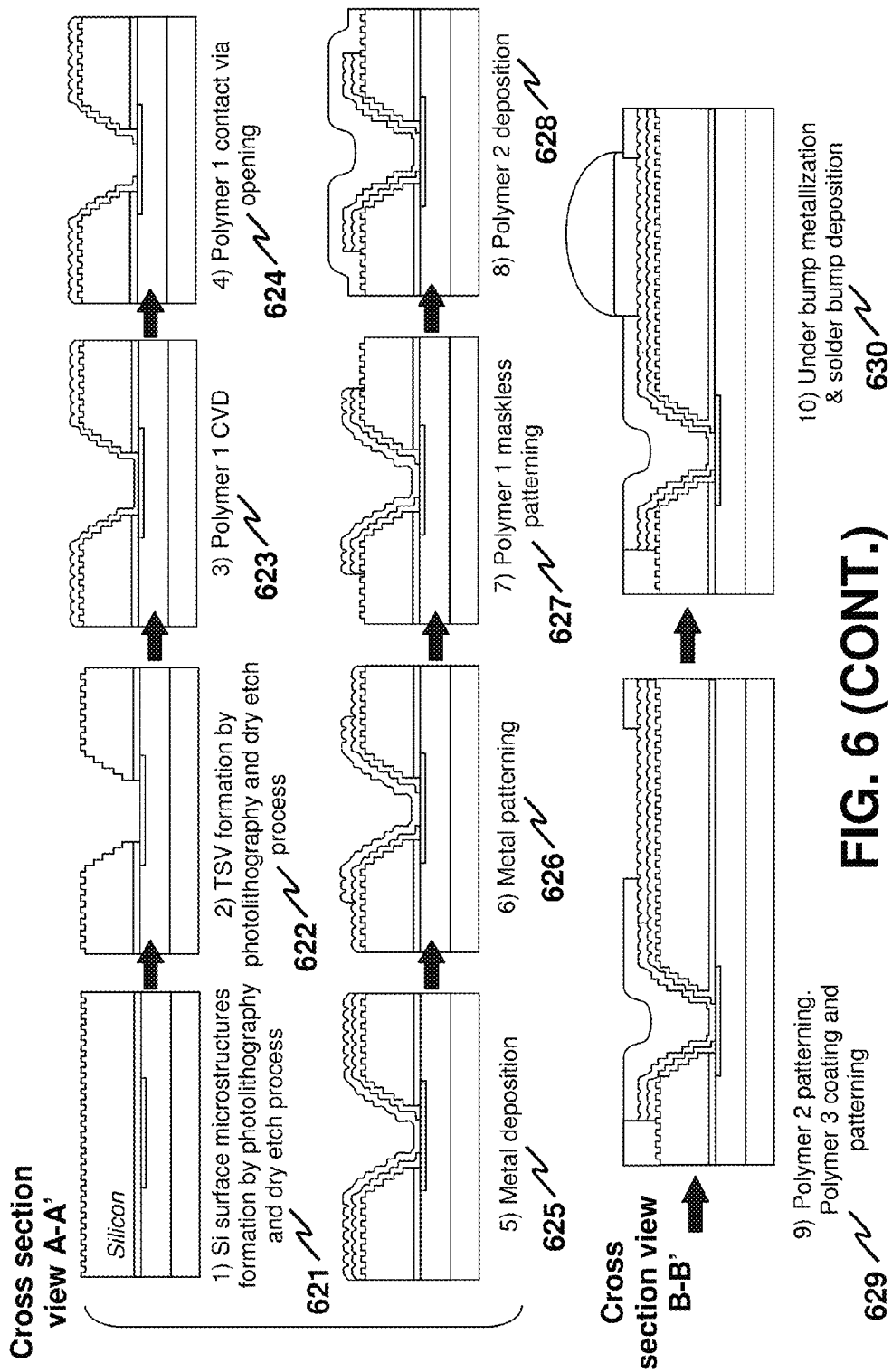

According to an embodiment of the present invention, FIG. 6 depicts a process for fabricating a TSV structure configured to provide an electrical path between a first side and a second side of a silicon chip, the first side having a first-side surface, the second side having a second-side surface, the chip having a metal bond pad attached to the second-side surface. The process comprises steps 621-630, giving a resultant TSV structure 600.

In the first step 621, a plurality of substantially closely-packed microstructures is fabricated on the first-side surface, wherein the microstructures are arranged to form a substantially non-random pattern, and a majority of the microstructures has a depth of at least 1 µm. Photolithography and dry etching may be used to fabricate the microstructures.

In the second step 622, a via through the chip from the first-side surface to the second-side surface is formed in order that the metal bond pad is exposed to the first side through the via. Photolithography and dry etching, for instance, may be used to fabricate the via. Additionally, a plurality of steps or scallops may be formed on the via's sidewall such that a majority of the steps or a majority of the scallops has a depth greater than 1 µm.

After the via is formed in the step 622, a first material, preferably a polymer, is deposited onto the first side without allowing the first material to cover a substantial part of the metal bond pad that is exposed to the first side. This deposition may be performed by the third step 623 and the fourth step 624. In the step 623, the first material is non-selectively deposited onto the first side so as to cover the first-side surface, the via's sidewall, and the metal bond pad that is exposed to the first side. CVD may be employed for this non-selective deposition. In the step 624, a substantial part of the first material that has been deposited on the metal bond pad is selectively removed, so as to form a contact opening on the metal bond pad for exposing the metal bond pad to the first side.

In the fifth step 625, metal is deposited onto the first side. In the sixth step 626, part of the metal already deposited is selectively removed so as to form a conductive layer on the substantial part of the metal bond pad that is exposed to the first side, on the via's sidewall and on a portion of the first-side surface surrounding the via.

In the seventh step 627, the first material that resides on the first-side surface not covered by the conductive layer is removed, so as to form a local isolation layer to isolate the conductive layer from a bulk of the chip. In particular, it can be removed by etching the first material and employing the conductive layer as a mask in the etching to protect the first material covered by the conductive layer from being etched. As an advantage, no additional masking is required.

In the eighth step 628, a second material, preferably a polymer, is deposited on the first side of the chip. In the ninth step 629, the second material deposited outside the TSV structure's perimeter is selectively removed to form a protective layer. The ninth step 629 further includes: depositing a soft protection material, preferably a polymer, onto the first side; and then selectively removing part of the soft protection material therefrom.

In the tenth step 630, solder bump deposition and under bump metallization are performed.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A through-silicon via structure for providing an electrical path between a first side and a second side of a silicon chip, the first side having a first-side surface and the second side having a second-side surface, the via structure comprising:
   a via penetrated through the chip from the first-side surface to the second-side surface, having a first end on the first-side surface and a second end on the second-side surface;
   a local isolation layer deposited on the via's sidewall and on a portion of the first-side surface surrounding the first end; and
   a plurality of substantially closely-packed microstructures arranged to form a substantially non-random pattern and fabricated on at least the portion of the first-side surface covered by the local isolation layer for promoting adhesion of the local isolation layer to the chip, wherein a majority of the microstructures has a depth of at least 1 µm.

2. The via structure of claim 1, wherein a majority of the microstructures has a width between 2 µm and 4 µm.

3. The via structure of claim 1, wherein the local isolation layer is substantially composed of a polymer material.

4. The via structure of claim 1, wherein the via is tapered or vertical.

5. The via structure of claim 1, wherein the sidewall includes a plurality of steps or scallops configured to promote adhesion between the sidewall and the local isolation layer deposited thereon, and wherein a majority of the steps or a majority of the scallops has a depth greater than 1 µm.

6. The via structure of claim 1, further comprising a conductive layer deposited on the local isolation layer to substantially cover, without contacting, the via's sidewall and the portion of the first-side surface covered by the local isolation layer, wherein the local isolation layer deposited on the first-side surface has an outer boundary substantially aligned with an outer boundary of the conductive layer that overlies the first-side surface.

7. The via structure of claim 6, wherein the conductive layer is substantially composed of metal.

8. The via structure of claim 6, further comprising a protective layer deposited on the conductive layer for covering the conductive layer and the local isolation layer.

9. The via structure of claim 8, wherein the protective layer is substantially composed of a polymer material.

10. The via structure of claim 8, further comprising a soft protection material deposited on the first-side surface, and attached to both the outer boundary of the local isolation layer deposited on the first-side surface and the outer boundary of the conductive layer that overlies the first-side surface, in order to protect edges of the local isolation layer and of the conductive layer from being exposed.

11. The via structure of claim 6, wherein the outer boundary of the local isolation layer deposited on the first-side surface is substantially aligned with a smallest outer boundary formed by enclosing the plurality of microstructures.

12. The via structure of claim 6, wherein the second end is covered with a metal bond pad located on the second-side surface, allowing the conductive layer to attach to the metal bond pad so as to form the electrical path between the first side and the second side.

13. The via structure of claim 1, further comprising:
a conductive layer deposited on the local isolation layer;
a protective layer deposited on the conductive layer; and
a soft protection material deposited on the first-side surface to protect edges of the local isolation layer and of the conductive layer from being exposed;
wherein the second end is covered with a metal bond pad located on the second-side surface in order that the metal bond pad is exposed to the first side through the via.

14. The via structure of claim 1, wherein the substantially non-random pattern is a checkerboard pattern.

15. A method of making the via structure of claim 13, the method comprising:
fabricating the plurality of substantially closely-packed microstructures on the first-side surface, wherein the microstructures are arranged to form a substantially non-random pattern, and wherein a majority of the microstructures has a depth of at least 1 µm;
forming the via through the chip from the first-side surface to the second-side surface in order that the metal bond pad is exposed to the first side through the via;
depositing a first material onto the first side without allowing the first material to cover a substantial part of the metal bond pad that is exposed to the first side;
depositing metal onto the first side and then selectively removing part of the metal therefrom so as to form the conductive layer on the substantial part of the metal bond pad that is exposed to the first side, on the via's sidewall and on a portion of the first-side surface surrounding the via;
removing the first material that resides on the first-side surface not covered by the conductive layer, so as to form the local isolation layer to thereby isolate the conductive layer from a bulk of the chip;
depositing a second material onto the first side, and then selectively removing part of the second material therefrom to form the protective layer; and
depositing the soft protection material onto the first side, and then selectively removing part of the soft protection material therefrom.

16. The method of claim 15, further comprising:
performing solder bump deposition and under bump metallization.

17. The method of claim 15, wherein the forming of the via includes:
forming a plurality of steps or scallops on the via's sidewall with a majority of the steps or a majority of the scallops having a depth greater than 1 µm.

18. The method of claim 15, wherein the first material that resides on the first-side surface not covered by the conductive layer is removed by etching the first material and employing the conductive layer as a mask in the etching to protect the first material covered by the conductive layer from being etched.

19. The method of claim 15, wherein the depositing of the first material onto the first side without allowing the first material to cover the substantial part of the metal bond pad that is exposed to the first side comprises:
non-selectively depositing the first material onto the first side so as to cover the first-side surface, the via's sidewall, and the metal bond pad that is exposed to the first side; and
selectively removing a substantial part of the first material that has been deposited on the metal bond pad, so as to form a contact opening on the metal bond pad for exposing the metal bond pad to the first side.

20. The method of claim 15, wherein any of the first material, the second material and the soft protection material is substantially composed of a polymer material.

* * * * *